(12) United States Patent
Tsu-Jae

(10) Patent No.: US 6,894,327 B1
(45) Date of Patent: May 17, 2005

(54) NEGATIVE DIFFERENTIAL RESISTANCE PULL UP ELEMENT

(75) Inventor: King Tsu-Jae, Freemont, CA (US)

(73) Assignee: Progressant Technologies, Inc., Mountain View, CA (US)

( * ) Notice: Subject to any disclaimer, the term of this patent is extended or adjusted under 35 U.S.C. 154(b) by 0 days.

(21) Appl. No.: 10/827,713

(22) Filed: Apr. 19, 2004

Related U.S. Application Data

(62) Division of application No. 10/298,916, filed on Nov. 18, 2002, now Pat. No. 6,724,024, which is a continuation of application No. 10/028,085, filed on Dec. 21, 2001, now Pat. No. 6,559,470.

(51) Int. Cl.[7] ............................................. H01L 29/80
(52) U.S. Cl. ......................... 257/262; 257/11; 257/14; 257/17; 257/201; 257/213
(58) Field of Search ............................. 257/11, 17, 14, 257/201, 262, 213

(56) References Cited

U.S. PATENT DOCUMENTS

| | | |
|---|---|---|
| 3,558,736 A | 1/1971 | McGroddy |
| 3,651,426 A | 3/1972 | Boatner et al. |
| 3,974,486 A | 8/1976 | Curtis et al. |
| 4,047,974 A | 9/1977 | Harari |
| 4,143,393 A | 3/1979 | DiMaria et al. |
| 4,686,550 A | 8/1987 | Capasso et al. |
| 4,806,998 A | 2/1989 | Vinter et al. |
| 4,851,886 A | 7/1989 | Lee et al. |
| 4,903,092 A | 2/1990 | Luryi et al. |
| 4,945,393 A | 7/1990 | Beltram et al. |
| 5,021,841 A | 6/1991 | Leburton et al. |
| 5,023,836 A | 6/1991 | Mori |
| 5,032,877 A | 7/1991 | Bate |
| 5,032,891 A | 7/1991 | Takagi et al. |
| 5,055,891 A | 10/1991 | Moll et al. |
| 5,084,743 A | 1/1992 | Mishra et al. |
| 5,093,699 A | 3/1992 | Weichold et al. |

(Continued)

FOREIGN PATENT DOCUMENTS

| | | |
|---|---|---|
| EP | 0747940 A2 | 12/1996 |
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| WO | WO 90/03646 | 4/1990 |
| WO | WO 99/63598 | 4/1999 |
| WO | WO 00/41309 | 7/2000 |
| WO | WO 01/65597 A1 | 9/2001 |
| WO | WO 01/69607 A2 | 9/2001 |
| WO | WO 01/99153 A2 | 12/2001 |

OTHER PUBLICATIONS

Final Report: SMILE MEL–ARI Project n•28741—Chapter V, pp. 184–194.

(Continued)

*Primary Examiner*—Michael S. Lebentritt
*Assistant Examiner*—Douglas Menz
(74) *Attorney, Agent, or Firm*—Bever, Hoffman & Harms LLP; Jeanette S. Harms

(57) ABSTRACT

A negative differential resistance device is disclosed which is particularly suited as a replacement for conventional pull-up and load elements such as NDR diodes, passive resistors, and conventional FETs. The NDR device includes a charge trapping layer formed at or extremely near to an interface between a substrate (which can be silicon or SOI) and a gate insulation layer. The NDR device can be shut off during static operations to further reduce power dissipation.

15 Claims, 5 Drawing Sheets

U.S. PATENT DOCUMENTS

| | | |
|---|---|---|
| 5,130,763 A | 7/1992 | Delhaye et al. |
| 5,162,880 A | 11/1992 | Hazama |
| 5,189,499 A | 2/1993 | Izumi et al. |
| 5,250,815 A | 10/1993 | Battersby et al. |
| 5,258,624 A | 11/1993 | Battersby et al. |
| 5,302,838 A | 4/1994 | Roenker et al. |
| 5,357,134 A | 10/1994 | Shimoji |
| 5,390,145 A | 2/1995 | Nakasha et al. |
| 5,442,194 A | 8/1995 | Moise |
| 5,448,513 A | 9/1995 | Hu et al. |
| 5,455,432 A | 10/1995 | Hartsell et al. |
| 5,463,234 A | 10/1995 | Toriumi et al. |
| 5,477,169 A | 12/1995 | Shen et al. |
| 5,523,603 A | 6/1996 | Fishbein et al. |
| 5,543,652 A | 8/1996 | Ikeda et al. |
| 5,606,177 A | 2/1997 | Wallace et al. |
| 5,633,178 A | 5/1997 | Kalnitsky |
| 5,675,157 A | 10/1997 | Battersby |
| 5,689,458 A | 11/1997 | Kuriyama |
| 5,698,997 A | 12/1997 | Williamson, III et al. |
| 5,705,827 A | 1/1998 | Baba et al. |
| 5,732,014 A | 3/1998 | Forbes |
| 5,742,092 A | 4/1998 | Zotov et al. |
| 5,761,114 A | 6/1998 | Bertin et al. |
| 5,770,958 A | 6/1998 | Arai et al. |
| 5,773,996 A | 6/1998 | Takao |
| 5,798,965 A | 8/1998 | Jun |
| 5,804,475 A | 9/1998 | Meyer et al. |
| 5,843,812 A | 12/1998 | Hwang |
| 5,869,845 A | 2/1999 | Van der Wagt et al. |
| 5,883,549 A | 3/1999 | De Los Santos |
| 5,883,829 A | 3/1999 | Van der Wagt |
| 5,895,934 A | 4/1999 | Harvey et al. |
| 5,903,170 A | 5/1999 | Kulkarni et al. |
| 5,907,159 A | 5/1999 | Roh et al. |
| 5,936,265 A | 8/1999 | Koga |
| 5,945,706 A | 8/1999 | Jun |
| 5,953,249 A | 9/1999 | Van der Wagt |
| 5,959,328 A | 9/1999 | Krautschneider et al. |
| 5,962,864 A | 10/1999 | Leadbeater et al. |
| 6,015,739 A | 1/2000 | Gardner et al. |
| 6,015,978 A | 1/2000 | Yuki et al. |
| 6,075,265 A | 6/2000 | Goebel et al. |
| 6,077,760 A | 6/2000 | Fang et al. |
| 6,084,796 A | 7/2000 | Kozicki et al. |
| 6,091,077 A | 7/2000 | Morita et al. |
| 6,097,036 A | 8/2000 | Teshima et al. |
| 6,104,631 A | 8/2000 | El-Sharawy et al. |
| 6,128,216 A | 10/2000 | Noble, Jr. et al. |
| 6,130,559 A | 10/2000 | Balsara et al. |
| 6,150,242 A | 11/2000 | Van der Wagt et al. |
| 6,184,539 B1 | 2/2001 | Wu et al. |
| 6,194,303 B1 | 2/2001 | Alphenaar et al. |
| 6,205,054 B1 | 3/2001 | Inami |
| 6,222,766 B1 | 4/2001 | Sasaki et al. |
| 6,225,165 B1 | 5/2001 | Noble, Jr. et al. |
| 6,246,606 B1 | 6/2001 | Forbes et al. |
| 6,261,896 B1 | 7/2001 | Jun |
| 6,294,412 B1 | 9/2001 | Krivokapic |
| 6,301,147 B1 | 10/2001 | El-Sharawy et al. |
| 6,303,942 B1 | 10/2001 | Farmer |
| 6,310,799 B2 | 10/2001 | Duane et al. |
| 6,396,731 B1 | 5/2002 | Chou |
| 6,404,018 B1 | 6/2002 | Wu et al. |
| 2001/0005327 A1 | 6/2001 | Duane et al. |
| 2001/0013621 A1 | 8/2001 | Nakazato |
| 2001/0019137 A1 | 9/2001 | Koga et al. |
| 2001/0024841 A1 | 9/2001 | Noble, Jr. et al. |
| 2001/0053568 A1 | 12/2001 | Deboy et al. |
| 2002/0093030 A1 | 7/2002 | Hsu et al. |
| 2002/0100918 A1 | 8/2002 | Hsu et al. |
| 2002/0109150 A1 | 8/2002 | Kajiyama |

OTHER PUBLICATIONS

News Release from www.eurekalert.org/releases/udel–udc–nflb.html, "UD Computer News: Future Looks Bright for Tunnel Diodes, Promising Faster, More Efficient Circuits," Oct. 1, 1998, 4 pages.

P.S. Barlow, et al., "Negative differential output conductance of self–heated power MOSFETs," IEE Proceedings–I Solid–State and Electron Devices, vol. 133, Part I, Nov. 5, Oct. 1986, pp. 177–179.

E. Chan, et al., "Compact Multiple–Valued Multiplexers Using Negative Differential Resistance Devices," IEEE Journal of Solid–State Circuits, vol. 31, No. 8, Aug. 1996, pp. 1151–1156.

E. Chan, et al., "Mask Programmable Multi–Valued Logic Gate Arrays Using RTDs and HBTs," IEE Proceedings–E: Computers and Digital Techniques, vol. 143, No. 5, Oct. 1996, pp. 289–294.

Deen, Jamal (editor) et al., excerpt from "CMOS RF modeling, characterization and applications," World Scientific, Apr. 2002, 34 pages.

Dozsa, L. et al., "A transient method for measuring current–voltage characteristics with negative differential resistance regions," Research Institute for Technical Physics, P. O. Box 76, H–1325 Budapest, Hungary, (Received Jul. 24, 1997; accepted Aug. 1, 1997), 2 pages.

Gardner, Carl, Ringhofer, Christian, "Smooth Quantum Hydrodynamic Model Simulation of the Resonant Tunneling Diode," Dept. Of Mathematics Arizona State University, pp. 1–5, (1998).

Geppert, Linda, "Quantum transistors: toward nanoelectronics," IEEE Spectrum, Sep. 2000, pp. 46–51.

Goldhaber–Gordon, David et al., "Overview of nanoelectronic devices," Proc. IEEE, 85(4), Apr. 1997, pp. 521–540.

Alejandro F. Gonzalez, et al., "Standard CMOS Implementation of a Multiple–Valued Logic Signed–Digit Adder Based on Negative Differential–Resistance Devices," Proceedings of the 30th IEEE International Symposium on Multiple–Valued Logic (ISMVL 2000), 6 pages.

Haddab, Y. et al., "Quantized current jumps in silicon photoconductors at room temperature," J. Appl. Phys. 86 (7), Oct. 1, 1999, pp. 3787–3791.

G. I. Haddad et al., "Tunneling Devices and Applications in High Functionality/Speed Digital Circuits," Solid State Electronics, vol. 41, No. 10, Oct. 1997, pp. 1515–1524.

Hansch, W. et al., "The planar–doped–barrier–FET: MOSFET overcomes conventional limitations," ESSDERC'97 27th European Solid–State Device Research Conference, Stuttgart, Sep. 22–24, 1997, 4 pages.

C. P. Heij, et al., "Negative Differential Resistance Due to Single–Electron Switching," Applied Physics Letters, vol. 74, No. 7, Feb. 15, 1999, 5 pages.

Hong, J.W. et al, "Local charge trapping and detection of trapped charge by scanning capacitance microscope in SiO2/SI system," Appl. Phys. Lett., 75 (12), Sep. 20, 1999, pp. 1760–1762.

Jungel, A, Pohl, C., "Numerical Simulation of Semiconductor Devices: Energy–Transport and Quantum Hydrodynamic Modeling," Fachbereich Math., Tech. Univ. Berlin, Germany, pp. 1–9, 1998.

Karna, Shashi P. et al., "Point defects in SI–SIO2 systems: current understanding," Published in G. Pacchioni et al. (eds.), "Defects in SiO2 and related dielectrics: science and technology," Kluwer Academic Publishers, p. 599–615, (2000), 19 pages.

King, Tsu–Jae et al., U.S. Appl. No. 09/602,658, entitled "CMOS Compatible Process for Making a Tunable Negative Differential Resistance (NDR) Device," filed Jun 22, 2000, 33 pages.

King, Tsu–Jae et al., U.S. Appl. No. 09/603,101, entitled "CMOS–Process Compatible, Tunable NDR (Negative Differential Resistance) Device and Method of Operating Same," filed Jun. 22, 2000, 34 pages.

King, Tsu–Jae et al., U.S. Appl. No. 09/603,102, entitled "Charge Trapping Device and Method for Implementing a Transistor having a Negative Differential Resistance Mode," filed Jun. 22, 2000, 39 pages.

S. J. Koester, et al., "Negative Differential Conductance in Lateral Double–Barrier Transistors Fabricated in Strained Si Quantum Wells," Applied Physics Letters, vol. 70, No. 18, May, 1997, pp. 2422–2424.

O. Le Neel, et al., "Electrical Transient Study of Negative Resistance in SOI MOS Transistors," Electronics Letters, vol. 26, No. 1, pp. 73–74, Jan. 1990.

S. Luryi and M. Mastrapasqua, "Light–emitting Logic Devices based on Real Space Transfer in Complementary InGaAs/InAlAs Heterostructures", in "Negative Differential Resistance and Instabilities in 2D Semiconductors", ed. by N. Balkan, B. K. Ridley, and A. J. Vickers, NATO ASI Series [Physics] B 307, pp. 53–82, Plenum Press (New York 1993).

Serge Luryi and Mark Pinto, "Collector–Controlled States and the Formation of Hot Electron Domains In Real–Space Transfer Transistors," AT&T Bell Laboratories, pp. 1–7, 1992.

Serge Luryi and Mark Pinto, "Collector–Controlled States in Charge Injection Transistors," SPIE–92 Symposium, pp. 1–12, 1992.

R. H. Mathews, et al., "A New RTD–FET Logic Family," Proceedings of the IEEE, vol. 87, No. 4, pp. 596–605, 1999.

P. Mazumder, et al., "Digital Circuit Applications of Resonant Tunneling Devices," Proceedings of the IEEE, vol. 86, No. 4, pp. 664–686, Apr., 1998.

S. Mohan, et al., "Logic Design Based on Negative Differential Resistance Characteristics of Quantum Electronic Devices," IEE Proceedings–G: Electronic Devices, vol. 140, No. 6, Dec. 1993, pp. 383–391.

S. Mohan, et al., "Ultrafast Pipelined Adders Using Resonant Tunneling Transistors," IEE Electronics Letters, vol. 27, No. 10, May 1991, pp. 830–831.

S. Mohan, et al., "Ultrafast Pipelined Arithmetic Using Quantum Electronic Devices," IEE Proceedings–E: Computers and Digital Techniques, vol. 141, No. 2, Mar. 1994, pp. 104–110.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor–based SRAM Cell (T–RAM) for High–Speed, Low–Voltage, Giga–scale Memories," Center for Integrated Systems, Stanford University, CA, (4 pages).

S.M.A. Nimour, R. Quasti, N. Zekri, "Effect of Spatially Disordered Barriers on the Band Structure of Finite Superlattices," phys. stat. sol. (b) 1998, 209, No. 2, 311–318.

R. Oberhuber, et al., "Tunnel–Devices with Negative Differential Resistivity Based on Silicon?," Source: Deutsch Forschungsgemeinschaft and Siemens AG, date unknown, 2 pages.

C. Pacha, et al., "Resonant Tunneling Device Logic Circuits," Microelectronics Advanced Research Initiative (MEL–ARI), Jul. 1998–Jul. 1999, pp. 1–22.

C. Pacha and K. Goser, "Design of Arithmetic Circuits using Resonant Tunneling Diodes and Threshold Logic," Lehrstuhl Bauelemente der Elektrotechnik, Universitat Dortmund, pp. 1–11, Sep. 1997.

S. L. Rommel, et al., "Room Temperature Operation of Epitaxially Grown SI/SiO.5Ge0.5/Si Resonant Interband Tunneling Diodes," Applied Physics Letters, vol. 73, No. 15, pp. 2191–2193, 1998.

Scoffield, John H. et al., "Reconciliation of different gate–voltage dependencies of 1/f noise in n–MOS and p–MOS transistors," IEEE Trans. Electron. Dev. 41 (11), 11 pgs.

A. Seabaugh, "Promise of Tunnel Diode Integrated Circuits," Tunnel Diode and CMOS/HBT Integration Workshop, Dec. 9, 1999, Naval Research Laboratory, Washington, DC., 13 pages.

Seabaugh A., Brar B., Broekaert T., Morris F., and Frazier G., "Resonant Tunneling Mixed Signal Circuit Technology," Solid–State Electronics 43:1355–1365, 1999.

Seabaugh, A. et al., "Tunnel–Diode IC," Minneapolis, Oct. 2, 2001, 23 pages.

Shao, Z., Porod, W., Lent, C., & Kirkner, D., "Transmission Zero Engineering in Lateral Double–Barrier Resonant Tunneling Devices," Dept. Of Electrical Engineering, University of Notre Dame, pp. 1–7 (1996).

Shoucair F. et al., "Analysis and Simulation of Simple Transistor Structures Exhibiting Negative Differential Resistance," EECS Department, UC Berkeley, Berkeley CA, (4 pages).

J. P. Sun, et al., "Resonant Tunneling Diodes: Models and Properties," Proceedings of the IEEE, vol. 86, No. 4, Apr. 1998, pp. 641–661.

J. P. A. Van der Wagt, "Tunneling–Based SRAM," Proceedings of the IEEE, vol. 87, No. 4, pp. 571–595, 1999.

J. P. A. Van der Wagt, et al., "RTD/HFET Low Standby Power SRAM Gain Cell," Source: Corporate Research Laboratories, Texas Instruments, 1998, 4 pages.

Villa, S. et al., "Application of 1/f noise measurements to the characterization of near–Interface oxide states in ULSI n–MOSFET's," Dipartimento di Elettronica e nformazione, Politecnico di Milano (Italy), 7 pages.

Wirth, G., et al., "Periodic transconductance oscillations in sub–100nm MOSFETs," ESSDERC'97 27th European Solid–State Device Research Conference, Stuttgart, Sep. 22–24, 1997, 4 pages.

G. Wirth, et al., "Negative Differential Resistance in Ultrashort Bulk MOSFETs" IECON'99 Conference Proceedings, vol. 1, San Jose, 1999, S. 29–34.

Jian Fu Zhang, "Traps: Detrapping," Wiley Encyclopedia of Electrical and Electronics Engineering Online, Article Posting Date: Dec. 27, 1999, John Wiley & Sons, Inc., 4 Pages.

Jian Fu Zhang, "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Jian Fu Zhang, "Traps: Measurement Techniques," Wiley Encyclopedia of Electrical and Electronics Engineering Online, Article Posting Date: Dec. 27, 1999, John Wiley & Sons, Inc., 5 Pages.

Jian Fu Zhang, "Traps: Origin of Traps," Wiley Encyclopedia of Electrical and Electronics Engineering Online, Article Posting Date: Dec. 27, 1999, John Wiley & Sons, Inc., 4 pages.

Jian Fu Zhang, "Traps: Trapping Kinetics," Wiley Encyclopedia of Electrical and Electronics Engineering Online, Article Posting Date: Dec. 27, 1999, John Wiley & Sons, Inc., 2 Pages.

Jian Fu Zhang, "Traps," Wiley Encyclopedia of Electrical and Electronics Engineering Online, Article Posting Date: Dec. 27, 1999, John Wiley & Sons, Inc., 2 Pages.

Zhang, J.F. et al., "A comparative study of the electron trapping and thermal detrapping in SiO2 prepared by plasma and thermal oxidation," J. Appl. Phys. 72 (4), Aug. 15, 1992, pp. 1429–1435.

Zhang, J.F. et al., "A quantitative investigation of electron detrapping in SiO2 under Fowler–Nordheim stress," J. Appl. Phys. 71 (12), Jun. 15, 1992, pp. 5989–5996.

Zhang, J.F. et al., "Electron trap generation in thermally grown SIO2 under Fowler–Nordheim stress," J. Appl. Phys. 71 (2), Jan. 15, 1992, pp. 725–734.

Fig. 4

| |
|---|
| Standard CMOS Starting Material |
| Standard CMOS Isolation Process |
| NDR Surface Doping Process Sequence |
| NDR Device Gate Insulator Formation |
| N-well Dopant Process Sequence (for PMOS) |
| P-well Dopant Process Sequence (For NMOS) |
| Logic Device Gate Oxidation |
| Gate Material Deposition and Patterning |
| NDR Drain Junction Engineering Sequence |
| Source/Drain Pattern and Process Sequence |
| Oxide Deposition |
| Contact Process Sequence |
| Metal Process Sequence |

NEGATIVE DIFFERENTIAL RESISTANCE PULL UP ELEMENT

CROSS REFERENCE TO RELATED APPLICATIONS

The present application claims priority to, and is a divisional of parent application Ser. No. 10/298,916 filed Nov. 18, 2002, titled FIELD EFFECT TRANSISTOR PULL-UP/LOAD ELEMENT now U.S. Pat. No. 6,724,024 which parent application is in turn a continuation of Ser. No. 10/028,085 entitled "IMPROVED NEGATIVE DIFFERENTIAL RESISTANCE FIELD EFFECT TRANSISTOR (NDR-FET) & CIRCUITS USING THE SAME" which was filed Dec. 21, 2001, now U.S. Pat. No. 6,559,470; both such applications are hereby incorporated by reference as if fully set forth herein.

The present application is also related to the following applications, all of which are filed simultaneously herewith, and which are hereby incorporated by reference as if fully set forth herein:

An application Ser. No. 10/028,084 entitled "INSULATED-GATE FIELD EFFECT TRANSISTOR INTEGRATED WITH NEGATIVE DIFFERENTIAL RESISTANCE (NDR) FET;" and An application Ser. No. 10/029,077 entitled "MEMORY CELL UTILIZING NEGATIVE DIFFERENTIAL RESISTANCE FIELD-EFFECT TRANSISTORS"; and An application Ser. No. 10/028,394 entitled "DUAL MODE FET & LOGIC CIRCUIT HAVING NEGATIVE DIFFERENTIAL RESISTANCE MODE";

An application Ser. No. 10/028,089 entitled "CHARGE PUMP FOR NEGATIVE DIFFERENTIAL RESISTANCE TRANSISTOR".

FIELD OF THE INVENTION

This invention relates to semiconductor devices and more particularly to an improved negative differential resistance (NDR) FET and circuits that utilize the same. The present invention is applicable to a wide range of semiconductor integrated circuits, particularly for applications where it is desirable to integrate NDR FET devices with conventional FETs and other similar logic/memory circuits, including in SOI and memory applications.

BACKGROUND OF THE INVENTION

A new type of CMOS compatible, NDR capable FET is disclosed in the following King et al. applications: Ser. No. 09/603,101 entitled "A CMOS-PROCESS COMPATIBLE, TUNABLE NDR (NEGATIVE DIFFERENTIAL RESISTANCE) DEVICE AND METHOD OF OPERATING SAME"; and Ser. No. 09/603,102 entitled "CHARGE TRAPPING DEVICE AND METHOD FOR IMPLEMENTING A TRANSISTOR HAVING A NEGATIVE DIFFERENTIAL RESISTANCE MODE"; and Ser. No. 09/602,658 entitled "CMOS COMPATIBLE PROCESS FOR MAKING A TUNABLE NEGATIVE DIFFERENTIAL RESISTANCE (NDR) DEVICE all of which were filed Jun. 22, 2000 and which are hereby incorporated by reference as if fully set forth herein. The advantages of such device are well set out in such materials, and are not repeated here.

In preferred embodiments, this device typically uses a dielectric layer for creating a charge trapping region that rapidly traps/detraps charge carriers. A number of different techniques are explained for forming said traps to achieve a desired NDR effect. It is apparent, nonetheless, that additional processing techniques (and/or more optimized versions of the processes described in King et al) would be beneficial for expanding the availability fo such devices.

A current trend also is to use so called silicon-on-insulator substrates to manufacture integrated circuits. It is expected that this technology will experience rapid growth in the years to come, but to date, only two terminal NDR diodes have been implemented in such environments. Thus, there is clearly a need for an NDR device that is as easy to integrate as a conventional FET in such technology.

Another growing trend is the use of NDR devices as load elements in SRAM memory cells and other circuit applications. To date, such NDR devices have been limited to two terminal, diode type structures which have operational limitations as well as integration complexities with CMOS processing. Furthermore, it is not possible, for example, to implement a low power memory cell using a single channel technology; current approaches are limited to conventional CMOS, where both p and n type transistors are required. Accordingly, there is an apparent compelling need for a low cost, easily integrable NDR solution for such applications as well.

SUMMARY OF THE INVENTION

Accordingly, an object of the present invention is to overcome the aforementioned deficiencies in the prior art;

Another object of the present invention is to provide an NDR FET that includes additional variations and improvements over the NDR FET described in King et. al.;

Still a further object of the present invention is to provide an additional type of trapping layer, and/or new types of charge traps that can be used advantageously in an NDR FET;

Another object of the present invention is to provide an NDR FET that is embodied within an SOI substrate;

Still a further object of the present invention is to provide a new type of general low power, single channel technology for effectuating logic and memory circuits;

Yet another object of the present invention is to provide an improved type of NDR device that is more flexible and more easily integrated (than prior NDR diode devices) into conventional semiconductor circuits, including SRAM memory cells.

These and other objects are provided by a first aspect of the present invention, which includes a semiconductor structure comprising a semiconductor substrate, and a dielectric layer (gate insulation layer) located on the semiconductor substrate, such that an interface region is formed between the semiconductor substrate and the dielectric layer. A plurality of carrier trapping sites within the interface region are configured for trapping carriers that are electrically biased by an electrical control field to move from a channel into the interface region. Thus, a current in the channel varies from a first current value associated with a conducting condition, to a second current value associated with a non-conducting condition, where the second current value is substantially less than the first current value.

In a preferred embodiment, a trap energy level for the trapping sites in the interface region is higher than a conduction band edge of the channel. Furthermore, the trap energy level is set so that said trapping sites trap primarily hot carriers (and not normal carriers) flowing in the channel to avoid interfering with the operation of the FET. To achieve this result, a trap energy level is set to approximately 0.5 eV higher than the conduction band edge. The semiconductor structure is incorporated as part of an insulated gate field effect transistor which otherwise behaves like a conventional FET in a first region of operation, but yet has NDR capability in a second region of operation.

In the preferred embodiment, the hot carriers tunnel from the channel to the trapping sites, but they are not energized to tunnel from the channel to a conduction band of the interface region. Nor is the interface region required to have a matching conduction band to facilitate a tunneling process, as required in conventional NDR devices.

Further in a preferred embodiment, an NDR FET shares one or more common structures with a conventional insulated gate field effect transistor (IGFET), so that a common set of processing operations can be used to manufacture both types of elements for an integrated circuit.

In other variations, the trapping sites can include water based traps created by a steam ambient. The NDR FET uses an n-type channel implanted with a p-type dopant so that a relatively large electric bias field can be set up to facilitate moving said carriers from said channel to said trapping sites.

In another aspect of the invention, a memory cell includes at least one first dopant type channel insulated gate field effect transistor (IGFET). The first-channel type IGFET has an IGFET gate terminal, an IGFET source terminal connected to a first potential, and an IGFET drain terminal coupled to a storage node. In lieu of a conventional two terminal diode, the present invention incorporates a negative differential resistance field-effect transistor (NDR-FET) element that also has a first dopant-type channel, and acts as a pull up or pull down device when connected in series with the IGFET. The NDR FET element includes a first NDR FET drain terminal connected to a second potential, a second NDR source terminal connected to the storage node, and a third NDR gate terminal connected to a bias voltage. In this fashion the memory cell is formed entirely of active devices having a common channel dopant type.

In a preferred embodiment, the NDR FET element and the IGFET share at least a common substrate and a common gate insulation layer. In addition, a common gate terminal for both can be fabricated from a single conductive layer. The two devices can further share one or more source/drain regions.

In this fashion, an NDR memory cell can be constructed that is integrated into a conventional fabrication process much easier than conventional NDR diodes. Furthermore, the cell can be made so that both devices use single channel type of dopant (i.e., both are n-channel or p-channel), and yet still achieve low power operation as with CMOS implementations.

BRIEF DESCRIPTION OF THE DRAWINGS

FIG. 4 is an illustrative process sequence for integrating the NDR-MISFET into a conventional CMOS logic process flow;

DETAILED DESCRIPTION OF PREFERRED EMBODIMENTS

Figure 1:
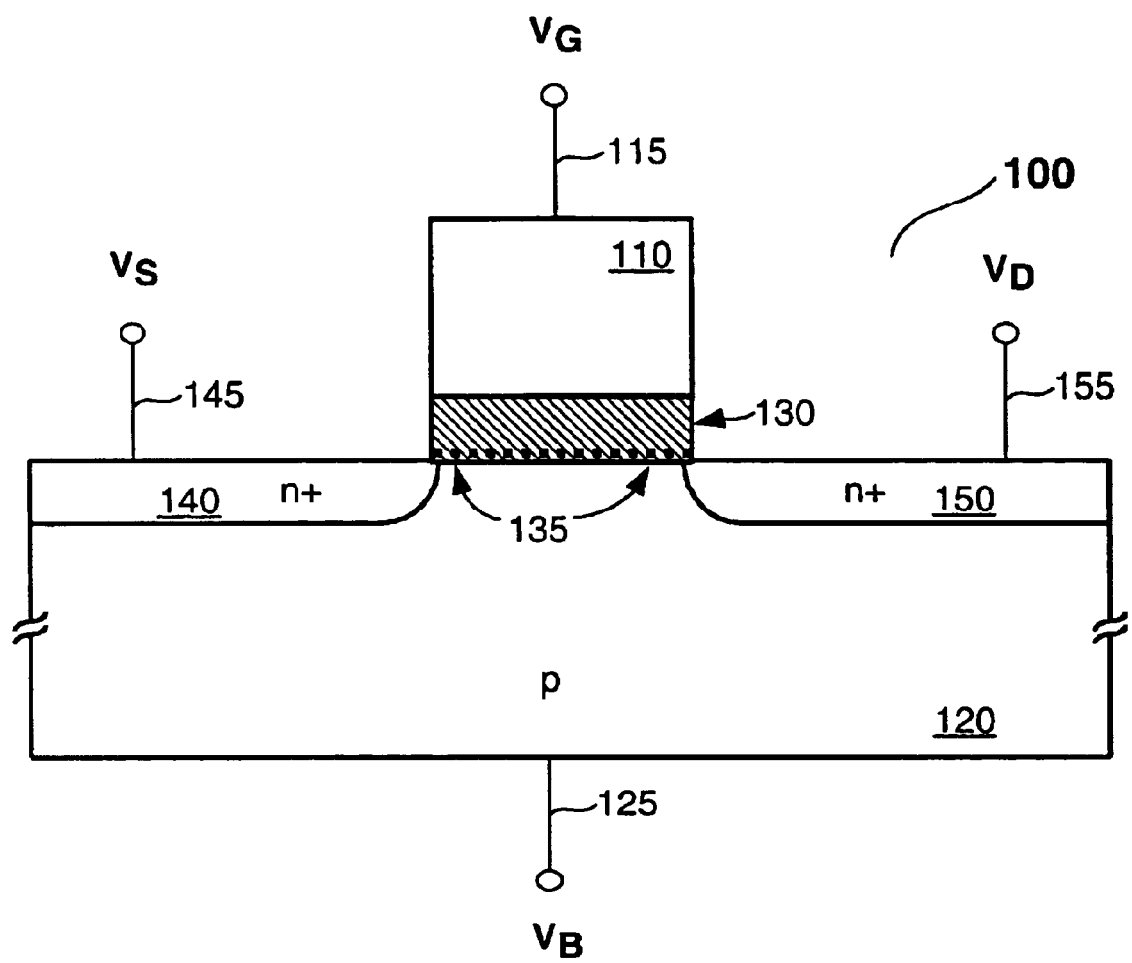
FIG. 1 is the schematic cross-sectional view of an embodiment of the NDR metal-insulator-semiconductor field-effect transistor (MISFET) disclosed in this invention, including a body contact terminal 125 for receiving an NDR mode enable/disable bias signal.

The following detailed description is meant to be illustrative only of particular embodiments of the invention. Other embodiments of the invention and variations of those disclosed will be obvious to those skilled in the art in view of the following description.

As discussed below, a preferred device embodiment is described first. Next, the mechanism responsible for the negative differential resistance (NDR) mode is described, followed by additional preferred embodiments for enhancing the performance of an NDR device. Finally, an exemplary method of fabrication will be described.

In accordance with a preferred embodiment of the invention, an n-channel MISFET NDR device structure (FIG. 1) 100 is provided which is made with minimum modification to a standard CMOS process. In fact, from a first glance, device 100 appears to be an ordinary n-channel MOS (NMOS) transistor, in which a gate electrode 110 of the device is formed on top of a semiconductor substrate 120 and electrically insulated from the substrate by a dielectric layer 130. Right away it can be seen that NDR device 100 in this invention is distinctly different from NDR devices in the prior art.

Prior-art NDR devices are typically two-terminal diode devices, made with very complicated and expensive process sequences which are incompatible with a conventional CMOS process. Although NDR device 100 in this invention is similar in appearance to an NMOS transistor, it incorporates slight but critical modifications, as taught in this invention, in order for the device to manifest the desired NDR output characteristic mode.

A first modification is that a p-type dopant concentration in a surface region of the semiconductor substrate underneath the gate electrode (the channel) is relatively high compared to a contemporary conventionally processed n-channel device. In a preferred embodiment of device 100, the p-type dopant concentration is greater than $1 \times 10^{18}$ cm$^{-3}$ in the channel. Of course, it will be understood that for any particular design rule, device characteristic and process environment the p-type dopant concentration may be varied accordingly, and that some routine design, simulation and/or testing may be necessary to optimize the performance of the device in any particular application. Accordingly, the present invention is not limited to any particular concentration, but, instead, is guided more by considerations of whether a sufficient dopant concentration has been introduced to help contribute to the NDR effect. More heavily doped n-type regions in the semiconductor surface region, adjacent to the channel and located at each end of the gate electrode, form the source and drain contact regions 140 and 150 respectively. The electric potential of the channel can be further adjusted via a body contact terminal 125.

A second modification of present device 100 over a conventional transistor is the fact that charge traps or storage nodes 135 exist in insulating layer 130 between semiconductor substrate 120 and gate electrode 110. These charge traps are located relatively close to (within 1.5 nm of) semiconductor-insulator interface 138, so that charges from semiconductor 120 can be trapped and de-trapped very quickly. Again it will be understood that this distance figure is based on the details of the present embodiment, and that for any particular environment this parameter may vary significantly, so the present invention is not limited by the particular details of the same. The key point, of course, is the existence of these charge traps, or some other physical feature that acts to store electrons. It will be understood of course that the drawing of FIG. 1 is merely an illustration to better describe the features of the present invention, and thus the arrangement and location of the trapping sites 135 is not drawn to scale. A third modification is that insulating layer 130 between semiconductor substrate 120 and gate electrode 110 is relatively thick (greater than 6 nm) to prevent significant loss of trapped charge to the gate electrode via tunneling. Those skilled in the art will again appreciate that this thickness is again a function of the particular material, processing environment, etc., and that the present invention is by no means limited to such figure.

Figure 2:
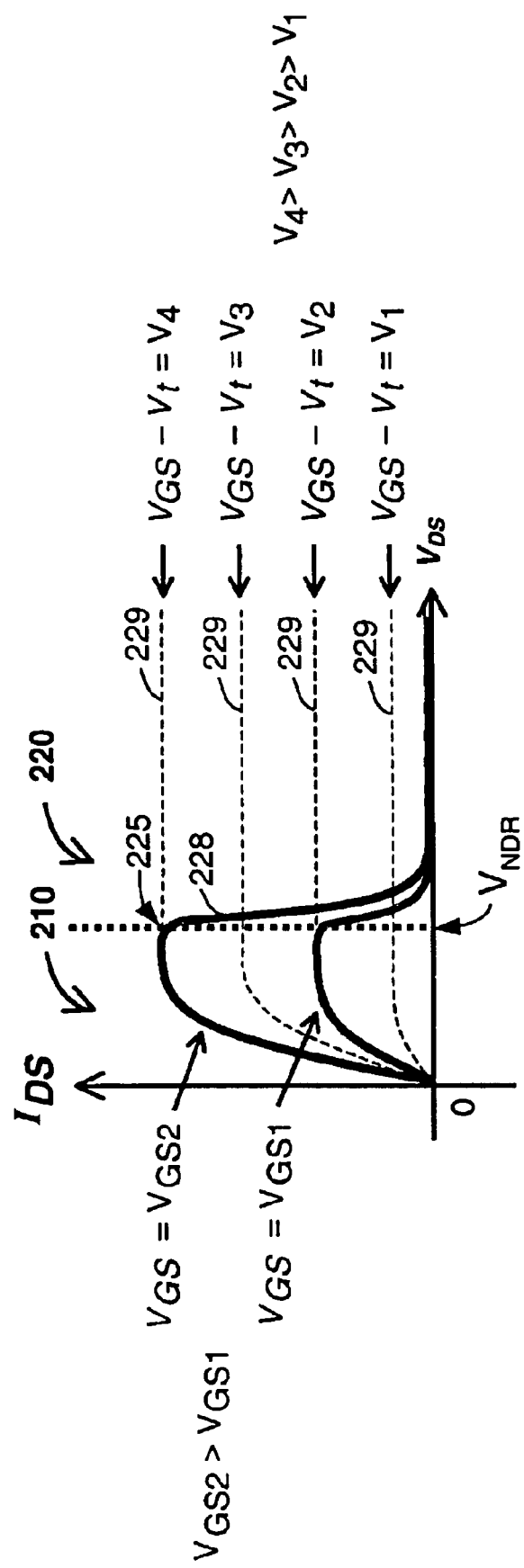
FIG. 2 is a graphical chart illustrating the current versus voltage (I-V) characteristics of the NDR-MISFET, including an NDR operating region.

With source and body terminals 145 and 125 of device 100 held at ground potential and gate terminal 115 biased sufficiently high to turn on the device, the output characteristic (drain current as a function of drain voltage) of device 100 will exhibit negative differential resistance over a range of drain voltages. This aspect of the invention is illustrated in FIG. 2, where device drain current versus drain voltage is plotted for two different gate voltages to show how the NDR mode can be affected by a suitable selection of the gate voltage. It can be seen that for a fixed gate voltage $V_{GS}$, drain current $I_{DS}$ firstly increases in a first region 210 with drain voltage $V_{DS}$, similarly to the behavior that is seen in drain current in a conventional NMOS transistor. Surprisingly, however, in region 220, beyond a certain drain voltage level, drain current decreases with further increases in voltage, i.e. the device exhibits an NDR mode with NDR characteristics. The drain voltage at which the drain current begins to decrease (i.e., point 225 where $V_{DS}=V_{NDR}$) is adjustable through suitable selections of channel length, threshold voltage, etc. It should be noted that, due to the relatively high channel dopant concentration and the relatively thick gate dielectric, the threshold voltage of the NDR FET will be significantly higher than that of a conventional MOSFET, so that a larger than typical gate voltage is correspondingly used for the NDR FET. As a result, $V_{GS}>V_{NDR}$ so that the vertical electric field is in the direction such that electrons are attracted towards the gate electrode, enhancing the NDR effect.

This behavior by device 100 of the present invention is rather surprising, and is apparently the result of physical mechanisms that have hitherto not been exploited in this area of semiconductor devices and processing. In the prior art, band-to-band quantum-mechanical tunneling of charged particles (electrons and/or holes) from one side of a diode to the other side is known to be the primary mechanism for NDR in tunneling diodes. In contrast, for device 100 of the present invention, the physical mechanism appears to be rapid trapping of electrons in the gate insulator underneath the gate electrode, near to (within 1.5 nm of) the semiconductor-insulator interface. Referring to the device structure in FIG. 1, when device 100 is biased with a sufficiently high gate voltage such that the channel of the device is in the strong-inversion condition (i.e. when the gate-to-source voltage is greater than the threshold voltage), a current flows between the source and drain terminals 145 and 155 respectively of the device if a small voltage is applied between such terminals. Since the channel is configured to contain a relatively high p-type dopant concentration, a vertical (in the direction perpendicular to the semiconductor surface) electric field in the channel is large (greater than $10^6$ V/cm). As the drain-to-source voltage increases, the lateral (in the direction parallel to the semiconductor surface) electric field increases, so that a composite (horizontal+vertical) electric field exerting force on inversion-layer electrons in the channel increases. Once this composite electric field reaches a certain critical value (which of course will be a function of the doping and geometry of the device) electrons flowing from source 140 to drain 150 will gain sufficient energy between collisions to surmount a semiconductor-insulator interface potential barrier. Since the vertical electric field component attracts the electrons toward gate electrode 110, electrons enter insulator 130 and subsequently are captured by the traps or storage nodes 135 in the insulator. The presence and accumulation of negative charge in insulator 130 dynamically increases a threshold voltage of device 100. In other words, the electrons accumulated in the traps/storage nodes 135 operate to set up a counter field that inhibits the movement of additional electrons into the channel from the source, and reducing an available channel current by reducing a density of electrons in the channel region. Thus, the net effect created by the traps/storage nodes 135 of the present invention is a drastic reduction in the inversion-layer charge density and commensurate reduction in the current flowing between the source and the drain. It can be seen plainly that the amount of net current in the channel that can be affected by the traps is a function of their number, concentration, location, and the bias conditions imposed on device 100, all of which are easily controllable and optimizable for any particular environment, so that the onset conditions, strength and operating region for a negative differential resistance mode can be tailored and customized as needed.

It is noted that the present disclosure teaches that only a single species of energetic carriers (hot electrons) are generated in a channel region and trapped in insulator 130, and both of these phenomena preferably occur in a substantially uniform manner throughout the channel length. This operation, too, is distinctly different from the case for a conventional NMOS transistor, in which hot electrons are generally generated in the depletion region of the drain p-n junction, leading to impact ionization and an avalanche effect resulting in significant numbers of hot holes as well as hot electrons. Typically, this effect is maximized at a gate-to-source voltage which is lower than the drain-to-source voltage (for example, at a gate voltage equal to one half the drain voltage); hence in a conventional device the vertical electric field in the channel near the drain junction attracts hot holes, rather than hot electrons, toward the gate electrode. Clearly, then, this explains why the creation of hot electrons in a conventional NMOS transistor (even if it occurs incidentally) cannot produce the negative differential resistance characteristic as described in this invention. Furthermore it is well known that the injection of hot holes into the gate insulator causes damage, adversely affecting the performance and reliability of the NMOS transistor. In the NDR-MISFET 100 of the present invention, although holes are generated by impact ionization in the channel, they are not injected (or their injection is substantially eliminated to the point where it is negligible from an operational perspective) into gate insulator 130 because the vertical electric field repels holes from gate electrode 110.

As a point of further clarification, the mechanism responsible for the NDR characteristic of the present invention also does not require that NDR MISFET 100 be operating in a conventional "pinch-off" condition, i.e., in which a gate-to-drain voltage is lower than a threshold voltage so that the inversion-layer charge density in the channel adjacent to the drain is zero. In the pinch-off condition, the lateral electric field is non-uniformly distributed in the channel between the source and drain: the electric field increases gradually and linearly with distance away from the source, and then increases exponentially in the depletion region of the drain junction, so that the generation of hot electrons occurs predominantly in the depletion region of the drain junction, resulting in drain avalanche. In contrast, in the present invention, NDR-MISFET 100 is preferably operated in a "triode" region, so that the electric field increases uniformly from the source end of the channel to the drain end. The drain current saturates due to velocity saturation, not pinch-off, so the current does not increase linearly with $V_{DS}$ (as seen generally in FIG. 2).

In a preferred embodiment of NDR-MISFET 100, sufficient bias is applied so that the electrons in the channel become so energetic that channel hot electrons are created due to the high composite electric field in the channel. These channel hot electrons have sufficient energy imparted from the horizontal component of this field to surmount the potential barrier at the semiconductor-insulator interface and enter gate insulator 130 because the vertical electric field component attracts them toward gate electrode 110. The electrons are captured by the traps or storage nodes 135 in insulator 130; consequently the threshold voltage of the transistor increases dynamically. More charge is trapped as the drain-to-source voltage increases (for a constant gate voltage), because the generation of hot carriers (and thus the percentage of the current that is based on a hot carrier component) correspondingly increases, and it is these hot carriers that are trapped. As greater numbers of hot carriers are trapped, they increase the threshold voltage and thereby reduce the mobile charge density in the channel by a disproportionate amount (compared to the hot-carrier current charge amount), thus decreasing the drain current dramatically. This results in the negative differential resistance in the output (drain current versus drain voltage) characteristic. It can be seen also that more charge can be trapped by increasing the vertical component of the field as well, since this increases the likelihood that a charged carrier will be forced into a trap 135 in dielectric layer 130 (the trapping rate), and also increases a temporary storage/trapping time associated with the charge. It is not necessary, nonetheless, to trap a significant number of carriers, because even a small quantity stored in the trapping sites can be sufficient to deplete the channel of mobile carriers. It is also preferable to not increase the vertical field to the point where some deleterious side effects (dielectric breakdown or lack of fast reversibility of the NDR effect for example) are seen. In other words, it is generally desirable to have the charges rapidly trapped and de-trapped at a particular rate that ensures that the device can be put into and out of an NDR mode or operating region quickly, instead of being confined to working within a particular region. Other techniques for increasing the amount of trapped charges, and the trapping/detrapping rates will be apparent to those skilled in the art. For instance, it may not be necessary in fact in some applications, to make the electrons "hot" because they will still be swept by the vertical field into the trapping sites.

Thus, the present invention uses an approach that is in contrast to that of prior art which has charge traps, such as U.S. Pat. No. 5,633,178. In the prior art, the emphasis has been on retaining the charge as long as possible, and this reference for example specifically discloses using a refresh operation to keep the logic state. Accordingly, there is no effort made in the prior art to implement or sustain a dynamic process where charges are continually trapped and de-trapped. In fact conventional disclosures discourage such condition because it has been perceived to date as an undesirable situation, and so this explains, too, why such references do not describe configuring a FET channel to have a structure and doping characteristics that would facilitate this type of trapping/detrapping mechanism.

The drain current and therefore the negative differential resistance in this invention can be adjusted by varying the gate voltage as seen in FIG. 2. As seen also in FIG. 2, the invention can be seen as exploiting the fact that, as the threshold voltage $V_t$ dynamically increases (because of the accumulation of trapped charges) with increasing drain-to-source voltage $V_{DS}$, a drain current $I_{DS}$ (which is proportional to $V_g-V_t$) will first increase, and then begin to decrease as $V_t$ begins to exceed $V_g$ and thus dominate the behavior of the device. Thus, a current value depicted in curve 228 will generally follow the set of continuous curves 229 shown in FIG. 2 for a given $V_g$ and varying $V_t$. The so-called "peak-to-valley ratio," a key figure of merit in NDR devices, can also be tuned in the present invention through suitable combinations of doping concentrations, device geometries and applied voltages.

The present invention bears some resemblance to a leaky (or volatile) floating gate storage device. However, the trapping and de-trapping of electrons in gate insulator 130 of NDR-MISFET 100 are very rapid processes, as compared to the programming and erase processes of a conventional floating-gate non-volatile memory device, so that the threshold voltage of NDR-MISFET 100 can respond dynamically to changes in a gate-to-source voltage and/or a drain-to-source voltage. In fact, while conventional memory devices require extensive pre-programming and erase cycle times to change threshold states, the threshold voltage of the present device responds to the applied source to drain bias voltage with minimal delay. Thus, it can change and reverse a threshold (and thus achieve an NDR mode) in substantially the same time as it takes for device 100 to turn the channel on or off in response to such bias conditions. For any given bias condition (fixed gate-to-source and drain-to-source voltages), a steady-state condition exists in which electrons are continually being rapidly trapped, stored, and de-trapped, maintaining a fixed amount of net charge trapped in gate insulator 130. The fixed amount of net charge trapped in the gate insulator is dependent on the particular voltage bias conditions applied to device 100. As the gate-to-source voltage and/or the drain-to-source voltage changes, the balance of the trapping and de-trapping processes changes, thereby changing the fixed amount of net charge trapped in the gate insulator and dynamically changing the threshold voltage. This means the net NDR effect can be controlled through two different bias parameters, a significant advantage again over conventional two terminal NDR devices. Furthermore, the negative differential resistance characteristic is seen not only as the drain-to-source voltage is increased from zero Volts to a high value (such that hot electrons are trapped in gate insulator 130), but also in the reverse direction as the drain-to-source voltage is decreased from a high value to zero Volts. It is expected, in fact that the threshold voltage variability/reversibility can be tailored to be relatively symmetric, so that it can thus be adjusted from a relatively low voltage value to a relatively high voltage value in approximately the same time required to adjust the threshold voltage from a relatively high voltage value to a relatively low voltage value.

As intimated above, the inventors believe that at higher drain to source voltages another feature of the present invention will be apparent, and that is the relatively high percentage of hot carriers in the channel current. Namely, since hot carriers are generated at a faster rate as the drain to source voltage increases the inventors believe that the net result is that eventually the hot carrier current component of the channel current will become dominant, and thus eventually constitute the only current component in the channel, even if it is extremely small overall. The relative percentage of hot carriers in the channel current, therefore, can be controlled, and this feature of the invention may be beneficial in other application environments.

Another aspect of the invention that is potentially useful is the fact that the trapping sites of the present invention can be thought of as introducing a form of current/charge delay on a single channel basis. The trapping time, temporary storage time, and detrapping time making up such delay can be controlled as a function of the applied horizontal and vertical electrical fields, and this aspect might be exploited in other environments.

As explained herein, the p-type dopant concentration in the surface region of the semiconductor underneath the gate electrode should be relatively high. This is to ensure that the vertical electric field is high (greater than $10^6$ V/cm) when the transistor is turned on, to promote the creation of hot electrons in the channel. A conventional NMOS transistor with channel length less than 250 nm may (in some applications) have such a high channel dopant concentration, but it will not achieve the results of the present invention because this structure alone is insufficient to bring about an NDR effect. In a preferred embodiment, the doping concentration is made slightly graded, so that the concentration of dopant is slightly lower at the semiconductor surface, and then peaks at some relatively small distance (below 30 nm) below the surface. This is done in order to achieve a built-in electric field, which in turn serves to confine electrons near the surface of the semiconductor, and thus further enhances the injection of electrons into the trapping sites in the dielectric. Again, other doping concentrations and techniques can also be employed to induce this same phenomenon.

Furthermore, to minimize the possibility of drain avalanche, a preferred embodiment herein teaches that the drain dopant-concentration profile at the junction with the channel is made to be relatively lightly doped. This not only minimizes the impact ionization current between the drain and the channel, but also has the side benefit of minimizing the capacitance between them. By minimizing the drain junction capacitance to the channel, the overall device switching performance is enhanced and the device thus operates faster. Those skilled in the art will appreciate that there are other ways to enhance the generation of hot electrons in the channel in addition to those described herein, and the present invention is not limited to any particular implementation of the same.

A preferred embodiment also confines the relatively high dopant concentration in the channel to the surface region only, so that the dopant concentration in the channel region is initially low (to confine electrons to the surface region), then increases, and then is made lower away from the surface to achieve the effect of low drain-junction capacitance. As alluded to earlier, the present invention is not limited to any particular doping concentration and profile of the dopant in the channel, because the range of such parameters necessary to bring about the NDR effect will vary from device to device of course, depending on the size, geometry, intended function, etc., of the device, but these details can be gleaned with routine and conventional simulation and testings for any particular application, in the same manner as is done for any other conventional semiconductor device. As explained previously, the high surface dopant concentration in the channel should also be offset from the highest dopant concentration in drain region 150 through the use of lightly doped drain (LDD) structures.

One additional and very desirable feature of the present invention is that the drain voltage at the onset of negative differential resistance can be scaled with the scaling of the CMOS technology. In other words, as the transistor channel length is reduced, the drain voltage required to reach the critical composite electric field in the channel (corresponding to the onset of negative differential resistance) is commensurately reduced. This aspect of the invention ensures that the structures and methods taught herein are guaranteed to have substantial and meaningful future utility in advanced generations of devices and products that are made using smaller geometries, lower bias conditions, etc. than those currently available.

Figure 3:
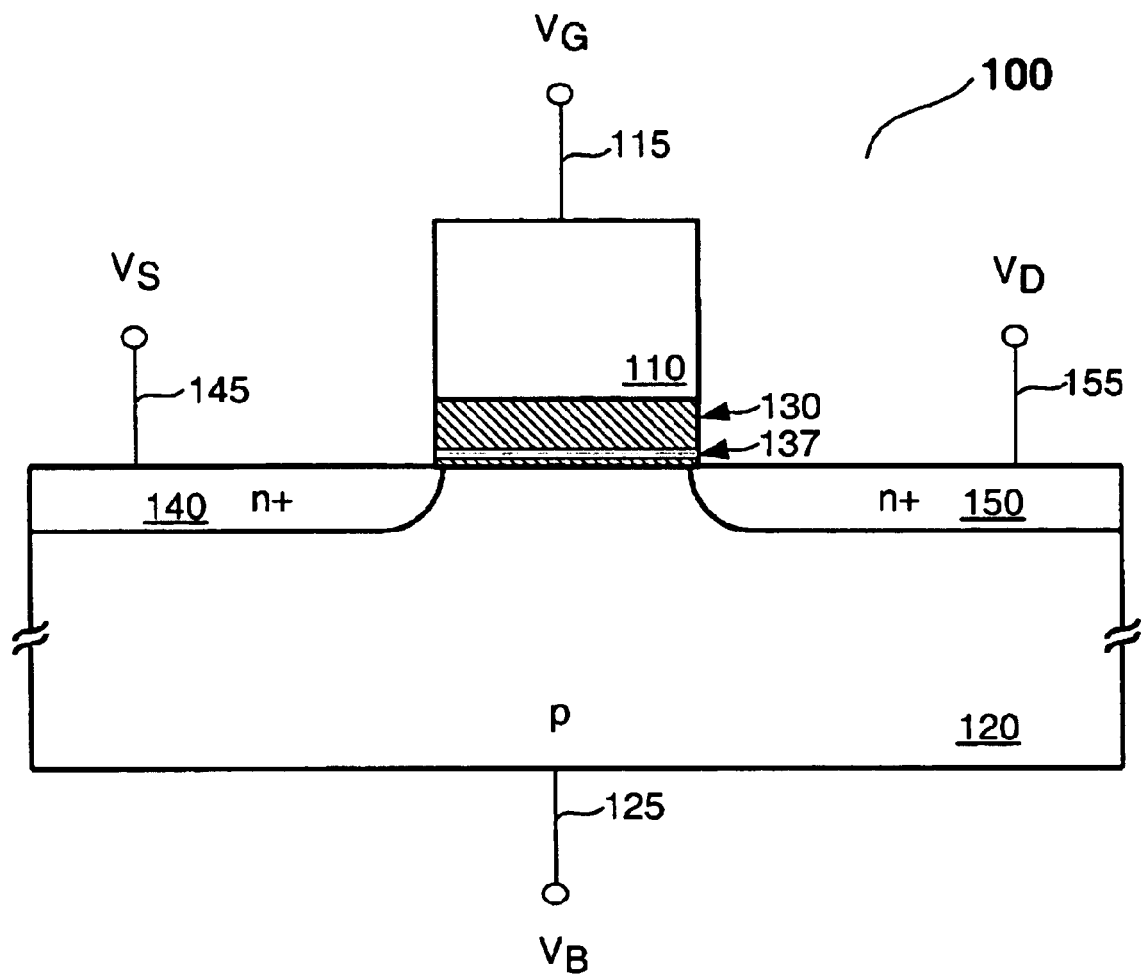
FIG. 3 is the schematic cross-sectional view of another embodiment of the NDR-MISFET disclosed in this invention including a body contact terminal 125 for receiving an NDR mode enable/disable bias signal.

As is evident, a key feature of NDR-MISFET 100 is that charge traps or storage nodes 135 exist in gate insulator 130, very near to (within 1.5 nm of) the semiconductor-insulator interface, so that electrons can be trapped and de-trapped very quickly. The creation and distribution/location of such traps 135 can be accomplished in any number of ways that are compatible with conventional semiconductor processing techniques. For example, traps 135 can consist of defect sites within gate dielectric 130 as shown in FIG. 1, or interfacial traps 135 between two or more layers of a multi-layered gate-insulator stack, or one or more electrically isolated ("floating") conductor or semiconductor electrodes 137 embedded within a gate insulator 130 (made up of two layers 130' and 130" sandwiching the embedded electrode 137) as shown in FIG. 3. The only important consideration is that the carrier trapping sites are configured for trapping carriers that are electrically biased by an electrical control field (i.e., the combined effect of bias conditions resulting from the channel doping, the gate to source voltage, the source to drain voltage) to move from the channel into insulator/dielectric layer 130. This can be done in any number of different concentrations and arrangements within layer 130 so that the channel current can be varied all the way from essentially zero (no conduction) to full conduction in accordance with the strength of the electrical control field.

In a preferred embodiment of the present invention, Boron atoms incorporated into gate insulator 130 during a thermal oxidation of heavily boron-doped silicon serve to provide defect sites which readily trap charge. Alternative embodiments may employ alternative dopant species such as Indium to form charge traps 135, and the present invention is not limited to any particular dopant species in this regard.

As mentioned, other possible embodiments may employ a multi-layered gate insulator, for example a very thin interfacial layer of silicon dioxide and a thicker layer of a second dielectric material such as silicon nitride, with charge-trapping sites at the dielectric-dielectric interface. Further possible embodiments may incorporate islands of metal, silicon or germanium nanocrystals embedded within gate insulator, or perhaps even a single continuous floating gate electrode (FIG. 3) 137, to trap charge. In fact, the present approach can be taken to an extreme to effectuate a new type of non-volatile floating gate electrode for a flash memory cell. It can be seen that complete non-volatility can be achieved by simply locating the trapping sites sufficiently far away from the interface so that the charge does not leak off after it is put there (using conventional programming techniques). This type of discontinuous floating gate electrode, formed as a multitude of trapping sites distributed in the gate dielectric, may have significant operating advantages over conventional continuous electrode. In particular, in the distributed charge storage sites aspect of the present invention, the trapped charge has less mobility than an electron in a sheet type electrode, and thus the charge storage sites are less likely to leak the stored charge (individually and in the aggregate of course) to the source/drain regions. This in turn means that the charge storage sites can be located closer to the channel, and thus the gate insulating layer can be thinner, the programming voltage and/or current smaller, etc., Other methods and techniques for creating and distributing traps 135 in a fashion suitable for achieving an NDR effect, and any non-volatile effects as shown herein will be apparent to those skilled in the art from the present teachings, and can be further gleaned from the descriptions given in the aforementioned prior art references for creating different types and arrangements of charge traps.

To enhance the electron trapping stemming from the generation of hot electrons in the channel (since it is the primary mechanism responsible for the negative differential resistance characteristic) the present disclosure also teaches a preferred embodiment of an insulator 130 for retaining the trapped charge under high gate-voltage bias. To avoid the loss of trapped electrons to gate electrode 110 via tunneling through gate insulator 130, the latter should have sufficient thickness to prevent or at least substantially reduce such tunneling effects. In a preferred embodiment insulator 130 is silicon dioxide formed by either one of, or a combination of conventional thermal oxidation and deposition techniques. As referred to earlier, to avoid significant loss of trapped charge due to quantum-mechanical tunneling, gate insulator 130 is formed to have a thickness of at least 6 nm. Other implementations of insulator material for layer 130 include Silicon Nitride ($Si_3N_4$), or Silicon Oxynitride ($SiO_xN_y$), or a high-permittivity dielectric (relative permittivity greater than 8). The use of a high-permittivity gate dielectric is advantageous for achieving high areal gate capacitance, which facilitates gate control of the channel potential. Again, the present invention is not restricted to any particular selection of thickness and material for insulator layer 130, and other variations/techniques for achieving a reduction in quantum-mechanical tunneling known in the art can be used to the extent they are compatible with the present objectives.

For a preferred embodiment of this invention, polycrystalline silicon (poly-Si) is used as the material for gate-electrode 110. Other possible embodiments may utilize alternative gate materials such as polycrystalline silicon-germanium or metals, or any number of other conventional materials.

An exemplary process for fabricating the NDR-MISFET in a conventional CMOS fabrication facility is depicted in FIG. 4. A standard p-type silicon starting substrate 120 is first processed through standard isolation-structure-formation process steps; the surface of substrate 120 is then moderately doped (to $\sim 5 \times 10^{18}$ $cm^{-3}$) by a shallow Boron implant. Subsequent to this a deposition of silicon dioxide (~6 nm) is done (or thermal oxidation) in a manner so that the Boron becomes incorporated into a gate insulator 130 near the surface of silicon substrate 120. The resultant dopant concentration in the Si channel near the surface is several times lower than it is directly after the implant step above, due to segregation of Boron into gate insulator 130. As noted earlier, the Boron dopant then acts effectively as an electron trap during operation of device 100. In contrast to some of the prior art implantation techniques discussed earlier, the oxidation step appears to incorporate the Boron in a manner that facilitates shallow electron traps, making it easier for charge to move in and out of gate insulator 130.

Next, polycrystalline silicon is deposited and patterned to form gate electrode 110. N-type dopant ions such as Arsenic are subsequently implanted at moderate dose to form the lightly doped source/drain regions self-aligned to gate 110, after which sidewall spacers (not shown) are formed by conformal deposition and anisotropic etching of an insulating layer such as silicon nitride. Deep source/drain contact regions 140 and 150 are then formed by ion implantation of Arsenic or Phosphorus and thermal annealing to activate the dopants. Device fabrication is completed with standard passivation, contact and metallization processes. While not explicitly shown, it is apparent, because only conventional processing is required, that other CMOS devices can be formed in the same mask with the present NDR device 100, so that, for example, memory and logic circuits can be formed at the same time as the present device, and thus integrated directly to form a conventional CMOS circuit having NDR capability. While the above is explained with reference to a CMOS process, it will be appreciated by those skilled in the art that other types of starting semiconductor materials could also be used instead. Suitable and/or optimal processing conditions for achieving the NDR mode in any particular CMOS compatible environment will be easily designed and determined by those skilled in the art through conventional modelling and experimentation techniques.

As a final note it is preferable that during normal operation of device 100 that a body contact ($V_B$) should be electrically biased (e.g. at a fixed potential of 0 Volts, as is typical for n-channel MOSFETs). If body terminal ($V_B$) is not connected (i.e. is "floating") then the NDR behavior is drastically diminished or even eliminated. This is because holes which are generated by hot electrons will accumulate at the channel-to-source junction, forward biasing the junction and effectively reducing the transistor threshold voltage (counteracting the charge-trapping effect of increasing the threshold voltage), if the holes are not allowed to flow out of the channel region through the body contact. Thus, if NDR-MISFET 100 is implemented in a silicon-on-insulator substrate, or in a thin film of polycrystalline silicon, care must be taken to provide a body contact. This aspect of the invention can also be exploited of course for certain applications, where it may be potentially useful to be able to turn on or turn off the NDR mode by connecting or disconnecting (switching) a bias voltage to body terminal $V_B$, respectively.

With the prior art, even if a device exhibiting adequate negative differential resistance can be produced, it is still a daunting task to integrate such a device into a conventional CMOS process. Since the device in this invention is inherently an NMOS structure, integration of this device with conventional logic CMOS devices is straightforward. The illustrative flow in FIG. 4 allows an NDR device process module to be completely de-coupled from a conventional process, to allow for independent optimization of the NDR devices and the CMOS devices. This makes it more straightforward to scale the NDR device in this invention with future generations of CMOS integrated-circuit technology.

Additional Processing Variations

Theoretical analyses performed by the inventors indicate that the following conditions and additional process details can be sufficient to achieve an NDR FET in a deep-submicron CMOS technology. In particular, our results show that a peak electric field in the channel on the order of 0.5 MV/cm or higher is preferable. Furthermore, we have also discovered that water ($H_2O$) or Hydrogen can be used to form the aforementioned charge traps, in addition to the other species noted earlier. In a preferred approach, water-related traps are formed by oxidation of heavily boron doped Si followed by a subsequent anneal in a steam ambient. It is believed (but has not been confirmed) that the boron assists in the formation of water-based traps.

In addition, it is further preferable, for at least some geometries, to not use structures that may inhibit the generation of hot carriers in the channel, or significantly reduce the peak electric field. For example, some forms of conventional lightly doped drain (LDD) structures can impede the generation of such carriers, particularly if they are formed prior to the channel doping noted above.

Furthermore, in the discussions above pertaining to the preferred level of p-type dopant concentration in the channel, it will be understood by those skilled in the art that this refers to a "net" p type concentration level, and not the actual absolute value that might be implanted during any particular processing step, or which might be present during any intermediate step. In other words, regardless of the intervening doping operations, the present invention can be implemented in any fashion so long as the final p-type dopant concentration in the channel is on the order of $1 \times 10^{18}$ $cm^{-3}$ cm or higher, because this permits an appropriate electric field strength to be generated in the channel. In fact, as is apparent from the above, the onset of the NDR behavior can be controlled as well by appropriate tailoring of the channel doping concentration as well. It should be noted that these figures are merely preferable for existing geometries, and that other suitable values will be determinable by those skilled in the art for other geometries, structures, etc., based on the present teachings and other well-known techniques.

In another variation, a preferred embodiment of the present invention can also include a counter-doping step to tailor the NDR FET threshold voltage. This step is performed after the channel doping operation noted earlier, and is simply done to reduce the net p-type concentration in the channel. A higher level of Boron (greater than $5 \times 10^{18}$ $cm^{-3}$) may be desirable for some architectures implemented in deep submicron technologies. Conventional thermal annealing is also preferably employed to help incorporate some of the Boron into the gate dielectric so that it will facilitate the creation of appropriately configured trapping sites.

In yet another variation, although it is preferable in some substrates and applications that the body of the NDR FET be biased (e.g. at 0 V) to minimize the "floating body" effect, it is possible to tailor the design of the NDR FET to ensure that NDR behavior is maintained in the absence of a body bias. Thus, it is possible to implement the NDR FET using a silicon-on-insulator (SOI) substrate, without providing a body contact, for compact integration. Compatibility with SOI substrates is a useful feature, since such substrates will increasingly be used in IC manufacturing to achieve higher circuit operation speeds with lower power consumption, due to significant reductions in interconnect and junction capacitance.

As discussed above, a preferred primary mechanism for achieving NDR behavior in an insulated gate field-effect transistor is to trap energetic ("hot") carriers from a channel. The traps should be configured preferably so that a trap energy level should be higher than the semiconductor conduction band edge, in order for it to primarily (if not exclusively) trap hot carriers. For example, a trap which is energetically located 0.5 eV above the semiconductor conduction band edge can only trap electrons from the semiconductor which have kinetic energy equal to or greater than 0.5 eV. For high-speed NDR FET operation, it is desirable to have the carrier trapping and de-trapping processes occur as quickly as possible. As described in the above preferred embodiment, this result is achieved by placing traps in close proximity to the channel, i.e. within 1.5 nm of the gate-dielectric/semiconductor interface as previously stated.

A similar (if not superior in most cases) result would result if the traps were located right at the interface itself. In this regard it should be noted that interface traps which are energetically located well above the semiconductor conduction band edge will have no effect on FET performance until a significant percentage of the mobile carriers in the channel have sufficient kinetic energy to become trapped. The formation of such interface traps would also be preferable from a process integration standpoint, because it would eliminate the need to selectively form a separate trap-containing dielectric layer in the NDR FET regions of the semiconductor surface. Accordingly, in such instance an appropriate dopant or ion species (of the type mentioned earlier) could be implanted/diffused to position the traps in such interface region instead. The particulars of such implantation and/or diffusion operations will vary from implementation to implementation of course based on the particular geometry, layer compositions, layer thicknesses, desired trap characteristics, desired trap locations, etc., and thus the appropriate process parameters, including ion implantation energies and species will be easily determined through routine optimization by those skilled in the art.

Another apparent observation from the present teachings is the fact that devices employing the present invention utilize a type of tunneling to a charge "trap", and not tunneling to a conduction band per se as required in conventional NDR devices such as tunnel diodes. All that is required is that the carriers be given sufficient energy to penetrate the semiconductor-insulator interface potential barrier, and then be trapped by traps within one or more dielectric layers (including any or all of the $SiO_2$, $SiO_XN_Y$ and $Si_3N_4$ layers mentioned above). Thus, it is not necessary to set up a complicated set of precisely tuned layers in a particular fashion to achieve a continuous set of conduction bands as required in conventional NDR devices, and this is another reason why the present invention is expected to achieve more widespread use than competing technologies.

As an additional variation, the NDR FET of the present invention can be used to eliminate the need for p-channel transistors in low-power memory and logic circuits, including for example in an SRAM cell or in an inverter. In this regard, the invention provides the capability to implement low-power memory and/or logic functions using an all-NMOS (only n-channel devices) technology. Conventional CMOS technology requires significantly higher process complexity than an all-NMOS technology because of the need to define separate, electrically isolated n-type and p-type well regions, as well as separate n-type and p-type source/drain extension and contact regions. The present invention therefore provides the means to achieve more compact, simpler and overall less expensive circuit architectures and manufacturing processes.

While prior art devices (including memory cells) using single-type transistors are well-known, such devices have typically used either an active or passive load device, including for example a transistor and/or an implanted resistor or thin film resistor. The primary disadvantages of these past approaches are:

1. Significant static power dissipation
2. Reduced output voltage swing (differences between "high" and "low" values of output voltage)

Furthermore, some prior art NDR devices have been proposed as load devices for an SRAM cell (see U.S. Pat. No. 6,294,412 which is incorporated by reference herein) to reduce overall cell size, but these implementations have been limited to two terminal tunneling diodes, which require a specialized sequence of processing steps and hence would increase the complexity and cost of the IC fabrication process.

In contrast, in the present invention, an NDR FET does not require any non-standard processes and only requires that an additional signal line be provided to control a gate of such FET as noted above. Furthermore, since a channel region of the NDR FET uses a dopant common to a conventional insulated gate field effect transistor (IGFET), i.e., such as an n-type channel, these features can be formed at the same time during a manufacturing process.

Accordingly, a very beneficial use of the NDR FET of the present invention would include as a substitute for the NDR devices of an SRAM memory cell of the type noted in FIGS. 1a and 1b of U.S. Pat. No. 6,294,412 noted earlier, as either a pull-down or pull-up element in series with an appropriately biased IGFET. In such an embodiment, structural features critical to the operation of an IGFET shown therein, including for example, a gate insulation layer, source/drain regions, isolation regions, contacts, gate electrodes, etc., formed in a semiconductor die/wafer can all be formed at the same time during common operations and thus shared with an NDR FET of the present invention. From a process integration perspective, the present approach provides a substantial advantage, therefore, over mixed process load technologies.

Figure 5:
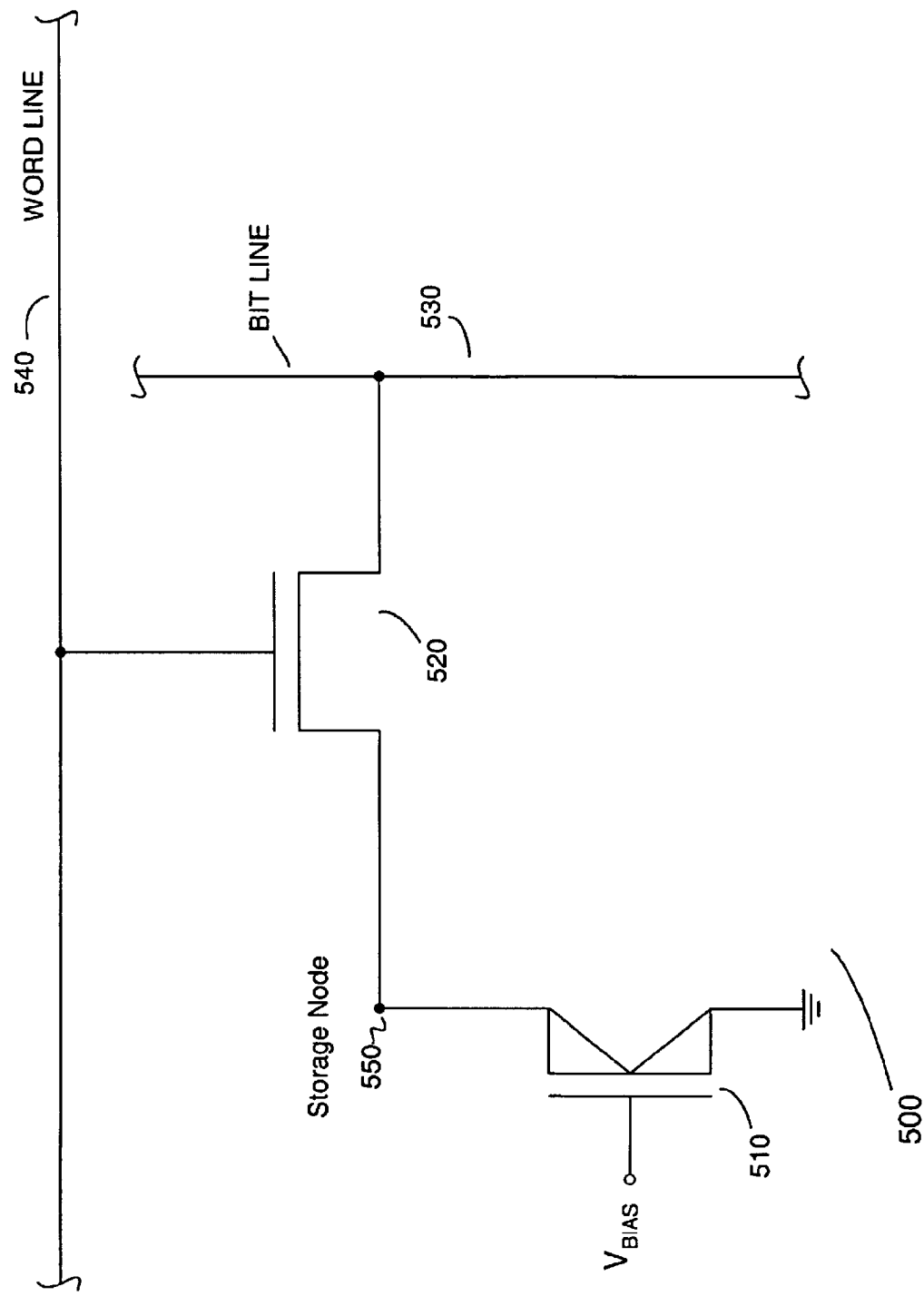
FIG. 5 is a circuit diagram of two (2) transistor SRAM cell formed by a combination of an NDR FET and a conventional FET.

Referring to FIG. 5, therefore, a preferred embodiment of a 2T SRAM cell 500 uses an NDR FET 510 including a gate electrode that is biased by an input signal Vbias (which can be fixed, or can be clocked). An NDR FET source is biased at a low potential Vss (e.g. 0V, or ground); its drain is connected to one of the source/drain terminals of an n-channel access transistor 520. The other source/drain terminal of access transistor 520 is connected to a data (bit) line 530. The gate of access transistor 520 is connected to a word line 540. Thus, such 2T SRAM cell requires four input/output lines: Vss, Vbias, WORD, BIT. Data is stored at node 550 shared by NDR FET 510 and access transistor 520.

To write data into cell 500, BIT line 530 is driven to an appropriate logic level (HI or LO, e.g. corresponding to a power supply Vdd or Vss, respectively), and then WORD line 540 is pulsed to a high voltage (e.g. Vdd). If the data to be written is HI, then storage node (SN) 550 is charged to the HI level through access transistor 520, and thereafter NDR FET 510 turns off. If the data to be written is LO, then SN 550 will be discharged to Vss, and NDR FET 510 turns off.

Thus, once data is written onto SN 550, the NDR FET 510 is turned off, to achieve low standby current. A pulse width (in units of time) of a WORD line voltage pulse should be wide enough to allow SN 550 to be charged fully to the HI level, or discharged fully to the LO level, and to allow NDR FET 510 to switch from NDR mode to non-NDR mode or vice versa. Accordingly the pulse width will vary of course from circuit to circuit and can be determined in accordance with well-known techniques.

To read data from cell 500, BIT line 530 is preferably precharged to the HI level, and then connected to the input of a conventional sense amplifier (not shown). WORD line 540 is then pulsed to a high voltage. If the data stored is HI, then SN 550 will not pull down the voltage on BIT line 530 through access transistor 520. If the data stored is LOW, then SN 550 will pull down the voltage on BIT line 530 through access transistor 520. As the BIT line voltage is pulled down, the voltage on SN 550 will rise, so that NDR FET 510 will turn on and help pull the BIT line voltage down through access transistor 520.

A sense amplifier can be designed through any conventional techniques to quickly detect (within nanoseconds) whether or not the BIT line voltage is being pulled down, and then amplify the data signal (e.g. outputs a voltage Vss if it detects that the BIT line voltage is dropping, otherwise maintains a high output voltage).

It should be noted that for fast data sensing (within 1 ns), a differential amplifier (requiring 2 inputs instead of 1) is preferable. In such cases a neighboring BIT line or "dummy" BIT line can be precharged to an appropriate level (e.g. Vdd/2) and used to provide the second input signal to the differential sense amplifier.

To compensate for potential leakage current and/or alpha-particle strikes, a periodic refresh can be performed to ensure that any HI voltages do not degrade with time.

It will be apparent to those skilled in the art the aforementioned NDR device can be advantageously employed in both memory and logic applications, and in the types of circuits as described in the prior art, i.e., as a memory device, as part of a logic circuit, a self-latching logic device, an amplifier, an oscillator, power management, and many other environments where its useful characteristics can be exploited.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious features (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A pull-up element for a semiconductor circuit comprising:
   a silicon based metal insulator semiconductor (MIS) negative differential resistance (NDR) field effect transistor (FET) coupled between a first node of the semiconductor circuit and a high voltage potential supplied to the semiconductor circuit.

2. The pull-up element of claim 1, wherein the circuit is a static random access memory (SRAM) cell and said first node is a storage node for storing a voltage representing a data value.

3. The pull-up element of claim 1, wherein the circuit is a logic circuit.

4. The pull-up element of claim 1, wherein said silicon based NDR MISFET is an n-channel device.

5. The load element of claim 1, wherein said silicon based NDR MISFET does not use band-to-band tunneling to achieve an NDR characteristic.

6. The load element of claim 1, wherein said silicon based NDR MISFET includes at least one source/drain region that is shared with a non-NDR silicon based MISFET within the semiconductor circuit.

7. A pull up element for a silicon-on-insulator (SOI) logic circuit which includes a field effect transistor comprising:
   a gated silicon based negative differential resistance (NDR) device coupled between a source/drain region of the field effect transistor and a high voltage potential supplied to the SOI logic circuit;
   wherein the silicon based NDR device and the field effect transistor share at least one common gate insulation layer.

8. The pull up element of claim 7, wherein said gated silicon based negative differential resistance (NDR) device is a charge trapping/detrapping field effect transistor (FET).

9. The pull up element of claim 7, wherein a channel region of the silicon based NDR device and a channel region of the field effect transistor include a common channel type dopant.

10. The pull up element of claim 7, wherein said NDR device does not use band-to-band tunneling to achieve an NDR characteristic.

11. A pull up element for a CMOS based logic circuit comprising:
    a silicon based negative differential resistance (NDR) device coupled between a first transistor and a high voltage potential supplied to the CMOS based logic circuit;
    said gated silicon based NDR device including an independent control gate which can be switched off during selected periods to reduce standby current of the CMOS based logic circuit.

12. The pull up element of claim 11, wherein said gated silicon based negative differential resistance (NDR) device is a field effect transistor (FET).

13. The pull up element of claim 11, wherein said gated silicon based NDR device selectively operates in an NDR mode based on a voltage signal applied to a drain region of such device.

14. The pull up element of claim 11, wherein said NDR device does not use band-to-band tunneling to achieve an NDR characteristic.

15. The pull up element of claim 11, wherein said silicon based negative differential resistance (NDR) device and an access transistor of the memory cell are formed with at least one common gate insulation layer and one common source/drain region.

* * * * *